United States Patent
Su et al.

(10) Patent No.: US 9,460,943 B2
(45) Date of Patent: Oct. 4, 2016

(54) GAS-LIQUID TWO-PHASE ATOMIZING CLEANING DEVICE AND CLEANING METHOD

(71) Applicant: Beijing Sevenstar Electronics Co., Ltd., Beijing (CN)

(72) Inventors: Yujia Su, Beijing (CN); Yi Wu, Beijing (CN)

(73) Assignee: BEIJING SEVENSTAR ELECTRONICS CO., LTD., Beijing (CN)

( * ) Notice: Subject to any disclaimer, the term of this patent is extended or adjusted under 35 U.S.C. 154(b) by 192 days.

(21) Appl. No.: 14/127,973

(22) PCT Filed: Apr. 1, 2013

(86) PCT No.: PCT/CN2013/073574
§ 371 (c)(1),
(2) Date: Dec. 20, 2013

(87) PCT Pub. No.: WO2014/082403
PCT Pub. Date: Jun. 5, 2014

(65) Prior Publication Data
US 2014/0311531 A1    Oct. 23, 2014

(30) Foreign Application Priority Data
Nov. 30, 2012  (CN) .......................... 2012 1 0506549

(51) Int. Cl.
H01L 21/67  (2006.01)

(52) U.S. Cl.
CPC .............................. *H01L 21/67051* (2013.01)

(58) Field of Classification Search
CPC .................................................. H01L 21/67051
See application file for complete search history.

(56) References Cited

U.S. PATENT DOCUMENTS

| | | | | |
|---|---|---|---|---|
| 6,148,536 A * | 11/2000 | Iijima | ...................... | B01D 1/20 239/404 |
| 6,935,576 B2 * | 8/2005 | Hara | ..................... | B05B 7/0475 239/104 |
| 2007/0113872 A1 * | 5/2007 | Uchida | ............. | H01L 21/67051 134/26 |
| 2008/0230092 A1 * | 9/2008 | Ko | .......................... | B08B 3/024 134/36 |
| 2009/0056746 A1 * | 3/2009 | Sandhu | ..................... | B08B 3/02 134/3 |
| 2011/0247661 A1 * | 10/2011 | Hayashida | ........ | H01L 21/67051 134/34 |

* cited by examiner

*Primary Examiner* — Michael Barr
*Assistant Examiner* — Benjamin L Osterhout

(57) ABSTRACT

The present invention provides a gas-liquid two-phase atomizing cleaning device. The cleaning device comprises a gas-liquid two-phase atomizing spray head. The spray head is a double jacket structure and comprises a nozzle, a rotating arm, a gas guide tube and a liquid guide tube; wherein the nozzle is connected with the rotating arm, the gas guide tube and the liquid guide tube are fixed to the rotating arm, the gas guide tube and the liquid guide tube are both provided with pneumatic valves.

16 Claims, 3 Drawing Sheets

GAS-LIQUID TWO-PHASE ATOMIZING CLEANING DEVICE AND CLEANING METHOD

CROSS-REFERENCE TO RELATED APPLICATION

This application claims the priority benefit of International Patent Application Serial No. PCT/CN2013/073,574, filed Apr. 1, 2013, which is related to and claims the priority benefit of China patent application serial no. 201210506549.9 filed Nov. 30, 2012. The entirety of each of the above-mentioned patent applications is hereby incorporated by reference herein and made a part of this specification.

FIELD OF THE INVENTION

The present invention relates to the field of semiconductor processing technology, more particularly to a gas-liquid two-phase atomizing cleaning device and cleaning method.

BACKGROUND OF THE INVENTION

With the critical dimensions of the integrate circuits scaled down to deep sub micrometer stage, the surface cleanliness of the wafer during the IC manufacturing process is increasingly demanding. In order to ensure the high cleanliness, hundreds of cleaning processes are required in the IC fabrication, which takes up 30% of the whole manufacturing process.

Further statistics show that more than 50% of the defectives during the semiconductor manufacturing processes are caused due to the surface contamination and incomplete cleaning. In the cleaning process, liquid phase fluid is injected to the wafer through the nozzles positioned above the wafer. When the injection speed is high, a physical effect will be produced on the wafer surface. Under the high speed impact force of the fluid flow as well as the centrifugal force of the wafer rotation, the impurities and contaminants in the wafer surface grooves can be corroded, dissolved or suspended in the liquid phase fluid, and then removed with the fluid, so as to achieve the cleaning effects. However, the transmission capability of the impurities and contaminants to the main body of the liquid phase fluid is unsatisfying, which reduces the cleaning efficiencies and effects.

On the other hand, with the decreasing size of the patterned features on the wafer, the pattern damage caused by the high speed fluid injection cannot be overlooked. Since the conventional jet cleaning technology produces big-size droplets or jet streams, the damage to the patterned features on the wafer surface in the processes at 65-nanometer and below becomes more severe. Furthermore, the lower utilization of the liquid phase fluid may also lead to huge waste of resources.

Nowadays, a nanoscale jet cleaning technology has been studied to reduce such damage. By the nanoscale jet cleaning technology, the injected fluid is in an atomized form consisted of thousands of nanoscale droplets. The injected nanoscale droplets fall on the wafer surface from the nozzles and clean the impurities and contaminants in the patterned structures on the wafer surface. Although compared with the conventional cleaning technology which produces continuous fluid or big-size droplets, the nanoscale jet cleaning technology reduces the wafer surface damage to some extent, there still exist some problems. Since the atomized nanoscale droplets are injected to the wafer at a high speed as well, such droplets may easily enter into the internal patterned features of the wafer when contacting the patterned features directly due to their small size, which may cause the damage in a deeper level. Furthermore, since not all the droplets are injected perpendicular to the wafer surface, the oblique jet flow may result in greater damage to the sidewalls and the edges of the patterned features.

Accordingly, there is a need for a cleaning apparatus and method that is able to improve the transmission ability of the impurities and contaminants to the fluid in an atomized form while minimizing damage to the wafer.

SUMMARY OF THE INVENTION

Accordingly, one objective of the present invention is to provide a gas-liquid two-phase atomizing cleaning device.

Another objective of the present invention is to provide a cleaning method in accordance with the gas-liquid two-phase atomizing cleaning device.

These and other objectives are met by the present invention, which in one aspect can be a gas-liquid two-phase atomizing cleaning device comprising: a gas-liquid two-phase spray head which is a double jacket structure and comprises a nozzle, a rotating arm, a gas guide tube and a liquid guide tube, wherein the nozzle is connected with the rotary arm, the gas guide tube and the liquid guide tube is fixed to the rotating arm, and the gas guide tube and the liquid guide tube are both provided with pneumatic valves.

In the device mentioned above, the nozzle and the rotating arm are integrated or connected through thread structures or ferrule structures.

In the device mentioned above, the rotating arm is hollow structured.

In the device mentioned above, the liquid guide tube is positioned inside the rotating arm; the liquid guide tube is provided with a pneumatic valve.

In the device mentioned above, the gas guide tube is positioned inside the rotating arm; the gas guide tube is provided with a pneumatic valve.

In the device mentioned above, the nozzle comprises a central pipe and an outer casing pipe, the central pipe is connected with the liquid guide tube or the liquid guide tube itself forms the central pipe by fixing the outlet thereof; the outer casing pipe is connected with the gas guide tube.

In the device mentioned above, the nozzle has a good sealing property. In the device mentioned above, the fluid flowing in the central pipe is liquid phase fluid, which can be chemical solutions or ultrapure water.

In the device mentioned above, the fluid flowing in the outer casing pipe is gas phase fluid, which can be $N_2$ or $CO_2$.

In the device mentioned above, a flow controller of the liquid phase fluid is further provided. The flow controller is connected with the inlet of the liquid guide tube and comprises a liquid supply pipeline, a parallel pipeline structure of two branch pipelines including a first branch pipeline and a second branch pipeline, and a spray head coupling end; the liquid supply pipeline is provided with a needle valve and a pneumatic valve which is disposed in series with the needle valve and connected with the two parallel branch pipelines; the first branch pipeline is provided with a pneumatic valve; the second branch pipeline is provided with a needle valve and a pneumatic valve in series; the two branch pipelines join to be a single pipeline, which forms the spray head coupling end and is provided with a suction valve.

When the suction valve is ensured to be operated stably, the pneumatic valve disposed on the upstream of the liquid supply pipeline for controlling the two parallel branch pipelines is turned off and the pneumatic valve on the gas guide tube is turned on at the same time, thus the spray nozzle is only fed with the gas phase fluid flowing in the outer casing pipe such as $N_2$, the injected gas phase fluid can be utilized for drying the wafer. Therefore, the conventional wafer drying device can be omitted in the present invention.

Another aspect can be a cleaning method in accordance with the gas-liquid two-phase atomizing cleaning device without the liquid phase fluid flow controller. The cleaning method comprises alternating performing a gas-liquid two-phase cleaning process and a single liquid phase cleaning process; wherein in the single liquid phase cleaning process, the pneumatic valve on the gas guide tube is turned off while the pneumatic valve on the liquid guide tube is turned on; in the gas-liquid two-phase cleaning process, the pneumatic valves on the gas guide tube and the liquid guide tube are both turned on at the same time.

When the pneumatic valves on the gas guide tube and the liquid guide tube respectively are both turned on at the same time, the gas phase fluid flowing in the outer casing pipe applies circumferential shear to the liquid phase fluid flowing in the central pipe, thus to accelerate the atomization of the liquid phase fluid, increase the kinetic energy of the liquid phase fluid and enhance the physical force of the injected fluid perpendicular to the wafer grooves and the fluid impact to the grooves. Therefore the diffusion and transmission of the impurities and the contaminants in the wafer grooves to the liquid phase fluid is accelerated, which increases the cleaning efficiencies and effects and helps to save the liquid phase fluid.

The atomized fluid injected from the nozzle rinses the wafer surface and forms a liquid membrane on the wafer surface. In this process, the physical force perpendicular to the wafer grooves arises, which improves the transmission of the impurities and the contaminants in the wafer grooves to the atomized fluid and increases the cleaning efficiencies and effects.

In the beginning of the cleaning process, the single liquid phase cleaning is performed when the nozzle moves from a position corresponding to one end of the wafer peripheral edge. Then the cleaning process is changed to the gas-liquid two-phase cleaning process when the nozzle moves through a position corresponding to the center of the wafer so as to transmit the impurities and the contaminants in the wafer grooves to the wafer peripheral edge. Thereafter, the single liquid phase cleaning process is performed again as the nozzle moves to a position corresponding to the other end of the wafer peripheral edge. The cleaning process is performed in the way that the nozzle moves from a first position corresponding to one end of the wafer peripheral edge to a second position corresponding to the other end by passing a third position corresponding to the center of the wafer and then moves back to the first position by passing the third position, and so on. When the nozzle is moved to the third position, the wafer is cleaned by the gas-liquid two-phase cleaning process, and when the nozzle moves to the first or second position, the wafer is cleaned by the single liquid phase cleaning process.

However, the gas-liquid two-phase fluid rinses the wafer surface with increased kinetic energy, which may cause impact to the patterned features of the wafer. Therefore a liquid phase fluid flow controller is also provided in the atomizing cleaning device of the present invention to reduce the liquid phase fluid flow, since the atomized fluid has small mass, the impact to the wafer surface and the damage to the patterned features can be decreased accordingly.

Another aspect can be a cleaning method in accordance with the gas-liquid two-phase atomizing cleaning device comprising the liquid phase fluid flow controller. The cleaning method comprises alternating performing a gas-liquid two-phase cleaning process and a single liquid phase cleaning process; and controlling the liquid phase fluid flow through the liquid phase fluid flow controller; wherein in the single liquid phase cleaning process, the pneumatic valve on the second branch pipeline of the fluid controller is turned off while the pneumatic valve on the first branch pipeline of the fluid controller is turned on, the liquid phase fluid flow is controlled by the needle valve on the liquid supply pipeline, the pneumatic valve on the gas guide tube of the spray head is turned off while the pneumatic valve on the liquid guide tube is turned on; in the gas-liquid two-phase cleaning process, the pneumatic valve on the first branch pipeline of the fluid controller is turned off while the pneumatic valve and the needle valve on the second branch pipeline of the fluid controller are turned on, the liquid phase fluid flow is controlled by the needle valve on the second branch pipeline, the pneumatic valves on the gas guide tube and the liquid guide tube of the spray head are turned on.

In the beginning of the cleaning process, the single liquid phase cleaning is performed when the nozzle moves from a position corresponding to one end of the wafer peripheral edge. Then the cleaning process is changed to the gas-liquid two-phase cleaning process when the nozzle moves through a position corresponding to the center of the wafer so as to transmit the impurities and the contaminants in the wafer grooves to the wafer peripheral edge. Thereafter, the single liquid phase cleaning is performed again when the nozzle moves to a position corresponding to the other end of the wafer peripheral edge. The cleaning process is performed in the way that the nozzle moves from a first position corresponding to one end of the wafer peripheral edge to a second position corresponding to the other end by passing a third position corresponding to the center of the wafer, and then moves back to the first position by passing the third position, and so on. When the nozzle moves to the third position, the wafer is cleaned by the gas-liquid two-phase cleaning process, and when the nozzle moves to the first or second position, the wafer is cleaned by the single liquid phase cleaning process.

According to the present invention, the cleaning process is performed by a gas-liquid two-phase atomizing cleaning device comprising a gas-liquid two-phase spray head, and during the cleaning process, the gas-liquid two-phase cleaning process and the single liquid phase cleaning process are performed alternately, so as to increase the physical force perpendicular to the wafer grooves and accelerate the transmission of the impurities and the contaminants in the wafer grooves to the main body of the atomized liquid phase fluid, which enhances the cleaning efficiencies and effects and saves liquid phase fluid.

Furthermore, a liquid phase fluid flow controller is also provided in the atomizing cleaning device of the present invention to reduce the liquid phase fluid flow. Since the atomized fluid has small mass, the impact to the wafer surface and the damage to the patterned features can be decreased.

Furthermore, the atomized liquid phase fluid possesses high kinetic energy and flows from the central part of the wafer surface to the peripheral edge, which is advantageous of carrying away the impurities and the contaminants from the wafer surface and reducing the pollutants caused by the splashing of the liquid droplets.

Furthermore, since the gas-liquid two-phase cleaning process and the single liquid phase cleaning process are performed alternately, the thickness of the liquid membrane formed on the wafer surface can be maintained, and the disturbance of the liquid membrane can be increased so as to accelerate the transmission of the impurities and the contaminants.

Furthermore, the conventional wafer drying device can be omitted in the present invention when the nozzle is only fed with the gas phase fluid such as $N_2$.

BRIEF DESCRIPTION OF THE DRAWINGS

The gas-liquid two-phase fluid atomizing cleaning device of the present invention will be elucidated by reference to the following embodiments and the accompanying drawings, in which.

DETAILED DESCRIPTION OF THE EMBODIMENTS

The gas-liquid two-phase fluid atomizing cleaning device and cleaning method of the presently preferred embodiments are discussed in further details hereinafter with respect the embodiments and the accompanying drawings. However, the embodiments described herein are not the only applications or uses contemplated for the invention. The specific embodiments discussed are merely illustrative of specific ways to make and use the invention, and do not limit the scope of the invention or the appended claims.

First Embodiment

Figure 1:
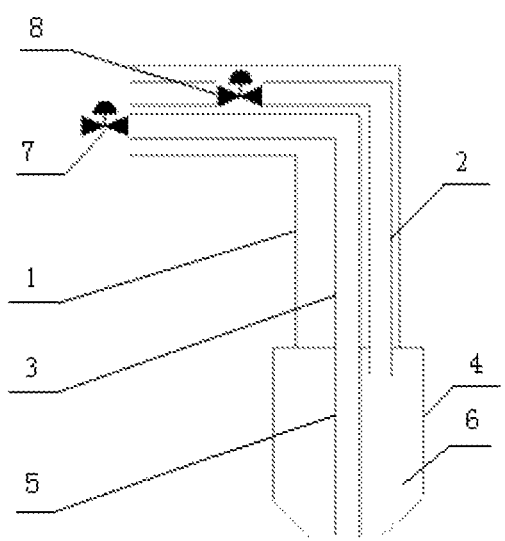
FIG. 1 is a schematic diagram of the gas-liquid two-phase fluid atomizing cleaning device according to an embodiment of the present invention.

As shown in FIG. 1, the gas-liquid two-phase atomizing cleaning device comprises a gas-liquid two-phase atomizing spray head, which is a double jacket structure. The spray head comprises a nozzle 4, a rotating arm 1, a gas guide tube 2 and a liquid guide tube 3. The nozzle 4 is connected with the rotating arm 1, the gas guide tube 2 and the liquid guide tube 2 are fixed to the rotating arm 1.

The nozzle 4 and the rotating arm 1 can be integrated, or the nozzle 4 can be connected with the rotating arm 1 through thread structures or ferrule structures. The rotating arm 1 is hollow structured, the liquid guide tube 3 and the gas guide tube 2 are positioned inside the rotating arm 1. The liquid guide tube 3 is provided with a pneumatic valve 7 and the gas guide tube 2 is provided with a pneumatic valve 8. The nozzle 4 comprises a central pipe 5 and an outer casing pipe 6, the central pipe 5 is connected with the liquid guide tube 3 or the liquid guide tube 3 itself forms the central pipe 5 by fixing its outlet. The outer casing pipe 6 is connected with the gas guide tube 2. The nozzle 4 has good sealing property. The fluid flowing in the central pipe 5 is liquid phase fluid, such as chemical solutions or ultrapure water; while the fluid flowing in the outer casing pipe is gas phase fluid, such as $N_2$ or $CO_2$.

Second Embodiment

Figure 2:
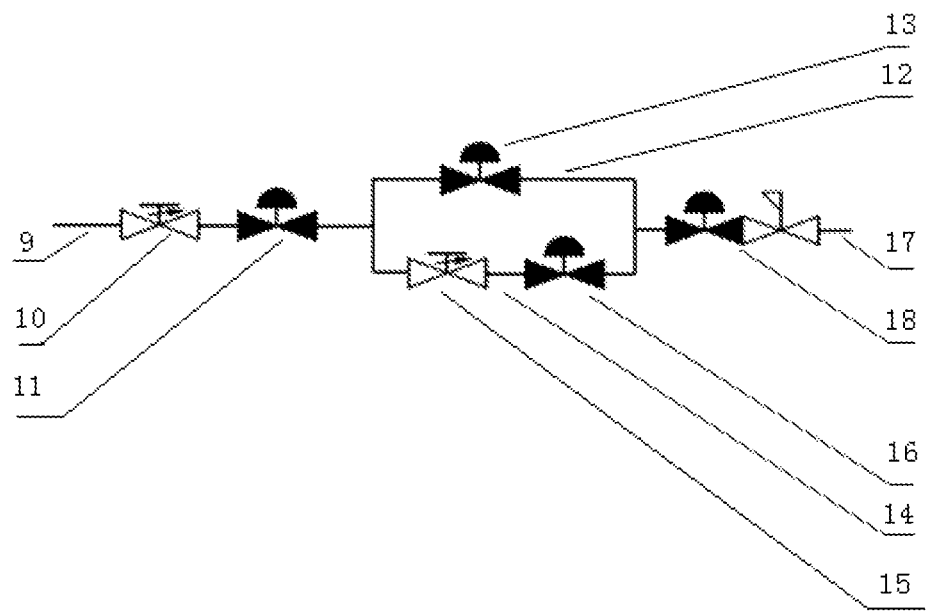
FIG. 2 is a schematic diagram of the liquid phase fluid flow controller according to an embodiment of the present invention.

In the embodiment, the gas-liquid two-phase atomizing cleaning device further comprises a liquid phase fluid flow controller, which is connected with the inlet of the liquid guide tube 3. As shown in FIG. 2, the flow controller has a parallel pipeline structure. To be specific, the flow controller comprises a liquid supply pipeline 9, a parallel pipeline structure of two branch pipelines including a first branch pipeline 12 and a second branch pipeline 14, and a spray head coupling end 17 which is connected with the inlet of the liquid guide tube 3. The liquid supply pipeline 9 is provided with a needle valve 10 and a pneumatic valve 11. The pneumatic valve 11 is disposed in series with the needle valve 10 and connected with the two parallel branch pipelines 12, 14. The first branch pipeline 12 is provided with a pneumatic valve 13 to supply liquid in the single liquid phase cleaning process, the second branch pipeline 14 is provided with a needle valve 15 and a pneumatic valve 16 in series to supply liquid in the gas-liquid two-phase cleaning process. The branch pipelines 12, 14 join to be a single pipeline, which forms the spray head coupling end 17 and is provided with a suction valve 18.

When the suction valve 18 is ensured to be operated stably, the pneumatic valve 11 disposed on the upstream of the liquid supply pipeline 9 for controlling the two parallel branch pipelines is turned off and the pneumatic valve 8 on the gas guide tube 2 is turned on at the same time, the nozzle is only fed with the gas phase fluid flowing in the outer casing pipe 6 such as $N_2$, the injected gas phase fluid can be utilized for drying the wafer. Therefore, the conventional wafer drying device can be omitted in the present invention.

Third Embodiment

The gas-liquid two-phase atomizing cleaning device performs a gas-liquid two-phase cleaning process and a single liquid phase cleaning process alternately to clean the wafer. In the embodiment, the liquid phase fluid flow controller is not provided in the gas-liquid two-phase atomizing cleaning device. In the single liquid phase cleaning process, the pneumatic valve 8 on the gas guide tube 2 is turned off while the pneumatic valve 7 on the liquid guide tube 3 is turned on; in the gas-liquid two-phase cleaning process, the pneumatic valves 8, 7 on the gas guide tube 2 and the liquid guide tube 3 respectively are both turned on at the same time.

Figure 3:
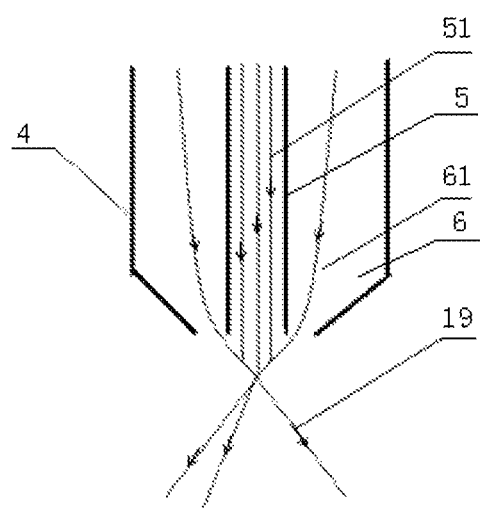
FIG. 3 is a schematic diagram showing the gas phase fluid flowing in the outer casing pipe applying circumferential shear to the liquid phase fluid flowing in the central pipe according to an embodiment of the present invention.

As shown in FIG. 3, when the pneumatic valves 8, 7 on the gas guide tube 2 and the liquid guide tube 3 respectively are both turned on at the same time, the gas phase fluid 61 flowing in the outer casing pipe 6 applies circumferential shear to the liquid phase fluid 51 flowing in the central pipe 5, thus to accelerate the atomization of the liquid phase fluid 51, increase the kinetic energy of the liquid phase fluid and enhance the physical force of the injected fluid perpendicular to the wafer grooves and the fluid impact to the grooves. Therefore the diffusion and transmission of the impurities and the contaminants in the wafer grooves to the liquid phase fluid is accelerated, which increases the cleaning efficiencies and effects and helps to save the liquid phase fluid.

Figure 4:
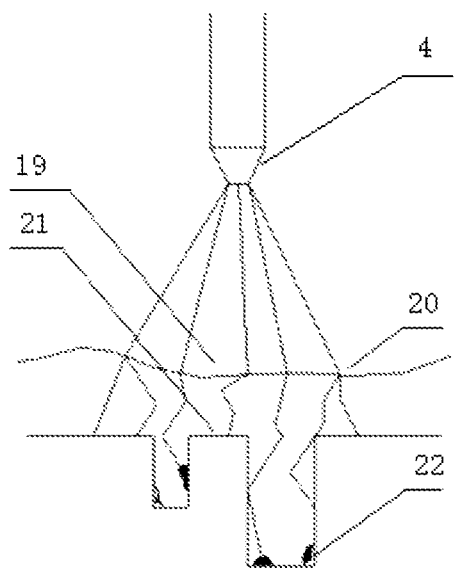
FIG. 4 is a schematic diagram of the wafer surface during the cleaning process according to an embodiment of the present invention.

As shown in FIG. 4, the atomized fluid 19 injected from the nozzle 4 rinses the wafer surface and forms a liquid membrane 20 on the wafer surface. In this process, the physical force perpendicular to the wafer grooves arises, which improves the transmission of the impurities and the contaminants 22 in the wafer grooves to the atomized fluid 19 and increases the cleaning efficiencies and effects.

Figure 5:
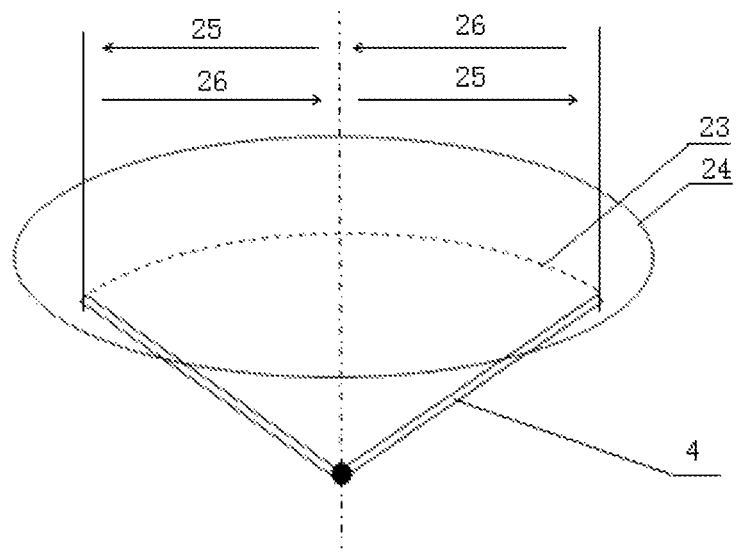
FIG. 5 is a schematic diagram showing the alternating processes of the gas-liquid two-phase cleaning process and the single liquid phase cleaning process.

As shown in FIG. 5, the gas-liquid two-phase cleaning process 25 cleaning from the center of the wafer to the peripheral edge and the single liquid phase cleaning process 26 cleaning from the wafer peripheral edge to the center are performed alternately, the movements 23 of the nozzle 4 corresponding to the cleaning process driven by the rotating arm prevent the formation of the water stain on the wafer 24 surface after the atomized droplets being dried. To be specific, in the beginning of the cleaning process, the single liquid phase cleaning process 26 is performed when the nozzle 4 moves from a position corresponding to one end of the wafer 24 peripheral edge. Then the cleaning process is changed to the gas-liquid two-phase cleaning process 25 when the nozzle 4 moves through a position corresponding to the center of the wafer 24 to transmit the impurities and the contaminants in the wafer grooves to the wafer peripheral edge. Thereafter, the single liquid phase cleaning process 26 is performed again when the nozzle moves to a position corresponding to the other end of the wafer 24 peripheral edge. The cleaning process is performed in the way that the nozzle 4 moves from a first position corresponding to one end of the wafer 24 peripheral edge to a second position corresponding to the other end by passing a third position corresponding to the center of the wafer 24 and then moves back to the first position by passing the third position, and so on. When the nozzle 4 is moved to the third position, the wafer 24 is cleaned by the gas-liquid two-phase cleaning process 25, and when the nozzle 4 moves to the first or second position, the wafer 4 is cleaned by the single liquid phase cleaning process 26.

Forth Embodiment

However, during the cleaning process mentioned above, the gas-liquid two-phase fluid rinses the wafer surface with increased kinetic energy, which may cause impact to the patterned features of the wafer. In the embodiment, the gas-liquid two-phase atomizing cleaning device also comprises a liquid phase fluid flow controller. The flow controller is used to reduce the liquid phase fluid flow, since the atomized fluid has small mass, the impact to the wafer surface and the damage to the patterned features can be decreased accordingly.

During the cleaning process, the gas-liquid two-phase cleaning process and the single liquid phase cleaning process are performed alternately. The flow of the liquid phase fluid in the central pipe 5 is controlled by the fluid controller mentioned above. In the single liquid phase cleaning process, the pneumatic valve 16 on the second branch pipeline 14 of the fluid controller is turned off while the pneumatic valve 13 on the first branch pipeline 12 of the fluid controller is turned on, the liquid phase fluid flow is controlled by the needle valve 10 on the liquid supply pipeline 9. At the same time, the pneumatic valve 8 on the gas guide tube 2 of the spray head is turned off while the pneumatic valve 7 on the liquid guide tube 3 is turned on. In the gas-liquid two-phase cleaning process, the liquid phase fluid flow is controlled to an appropriate level so as to adjust the atomized fluid. To be specific, the pneumatic valve 13 on the first branch pipeline 12 of the fluid controller is turned off while the pneumatic valve 16 and the needle valve 15 on the second branch pipeline 14 of the fluid controller are turned on, the liquid phase fluid flow is controlled by the needle valve 15 on the second branch pipeline 14. At the same time, the pneumatic valves 8, 7 on the gas guide tube 2 and the liquid guide tube 3 of the spray head are both turned on, thereby feeding liquid phase fluid into the central pipe 5 and the gas phase fluid such as $N_2$ into the outer casing pipe 6.

As shown in FIG. 5, the gas-liquid two-phase cleaning process 25 cleaning from the center of the wafer 24 to the peripheral edge and the single liquid phase cleaning process 26 cleaning from the wafer 24 peripheral edge to the center are performed alternately, the movements 23 of the nozzle 4 corresponding to the cleaning process driven by the rotating arm 1 prevent the formation of the water stain on the wafer 24 surface after the atomized droplets being dried. To be specific, in the beginning of the cleaning process, the single liquid phase cleaning process 26 is performed when the nozzle 4 moves from a position corresponding to one end of the wafer 24 peripheral edge. Then the cleaning process is changed to the gas-liquid two-phase cleaning process 25 when the nozzle 4 moves through a position corresponding to the center of the wafer 24 to transmit the impurities and the contaminants in the wafer grooves to the wafer peripheral edge. Thereafter, the single liquid phase cleaning process 26 is performed again when the nozzle 4 moves to a position corresponding to the other end of the wafer 24 peripheral edge. The cleaning process is performed in the way that the nozzle 4 moves from a first position corresponding to one end of the wafer peripheral edge to a second position corresponding to the other end by passing a third position corresponding to the center of the wafer 24, and then moves back to the first position by passing the third position, and so on. When the nozzle 4 moves to the third position, the wafer 4 is cleaned by the gas-liquid two-phase cleaning process 25, and when the nozzle 4 moves to the first or second position, the wafer 24 is cleaned by the single liquid phase cleaning process 26.

In the embodiment, the liquid phase fluid flow controller is provided to reduce the liquid phase flow. Since the wafer surface is rinsed by atomized fluid which has small mass, the fluid impact and the damage to the wafer surface can be reduced. Furthermore, the atomized liquid phase fluid possesses high kinetic energy and flows from the central part of the wafer surface to the peripheral edge, which is advantageous of carrying away the impurities and the contaminants from the wafer surface and reducing the pollutants caused by the splashing of the liquid droplets. In addition, during the cleaning process, the gas-liquid two-phase cleaning process and the single liquid phase cleaning process are performed alternately by utilizing the gas-liquid two-phase cleaning device of the present invention, the thickness of the liquid membrane formed on the wafer surface can be maintained, the disturbance of the liquid membrane can be increased to accelerate the transmission of the impurities and the contaminants.

The cleaning process can be performed by the gas-liquid two-phase cleaning device mentioned above as well as other devices having the similar structures.

Although the present invention has been disclosed as above with respect to the preferred embodiments, they should not be construed as limitations to the present invention. Various modifications and variations can be made by the ordinary skilled in the art without departing the spirit and scope of the present invention. Therefore, the protection scope of the present invention should be defined by the appended claims.

The invention claimed is:

1. A gas-liquid two-phase atomizing cleaning device for cleaning and drying a wafer, comprising:
   a gas-liquid two-phase atomizing spray head which is a double jacket structure and comprises a nozzle, a rotating arm, a gas guide tube and a liquid guide tube; wherein the nozzle is connected with the rotating arm, the gas guide tube and the liquid guide tube are fixed to the rotating arm, the gas guide tube and the liquid guide tube are both provided with pneumatic valves such that the gas-liquid two-phase atomizing spray head injects liquid phase fluid or gas-liquid two-phase fluid or gas phase fluid by controlling the on-off of the pneumatic valves; wherein,
   during a cleaning process, the gas-liquid two-phase atomizing spray head injects the gas-liquid two-phase fluid and the liquid phase fluid alternatively;
   during a drying process, the gas-liquid two-phase atomizing spray head injects the gas phase fluid.

2. The device according to claim 1, wherein the nozzle and the rotating arm are integrated or connected through thread structures or ferrule structures.

3. The device according to claim 1, wherein the rotating arm is hollow structured.

4. The device according to claim 1, wherein the liquid guide tube is positioned inside the rotating arm.

5. The device according to claim 1, wherein the gas guide tube is positioned inside the rotating arm.

6. The device according to claim 1, wherein the nozzle comprises a central pipe and an outer casing pipe, the central pipe is connected with the liquid guide tube or the liquid guide tube itself forms the central pipe by fixing the outlet thereof; the outer casing pipe is connected with the gas guide tube.

7. The device according to claim 6, wherein the fluid flowing in the central pipe is liquid phase fluid; the fluid flowing in the outer casing pipe is gas phase fluid.

8. The device according to claim 1, further comprises a liquid phase fluid flow controller, which is connected with the inlet of the liquid guide tube; wherein the liquid phase fluid flow controller comprises a liquid supply pipeline, a parallel pipeline structure of two branch pipelines including a first branch pipeline and a second branch pipeline, and a spray head coupling end; the liquid supply pipeline is provided with a needle valve and a pneumatic valve which is disposed in series with the needle valve and connected with the two parallel branch pipelines; the first branch pipeline is provided with a pneumatic valve; the second branch pipeline is provided with a needle valve and a pneumatic valve in series; the two branch pipelines join to be a single pipeline, which forms the spray head coupling end and is provided with a suction valve.

9. The device according to claim 8, wherein the nozzle and the rotating arm are integrated or connected through thread structures or ferrule structures.

10. The device according to claim 8, wherein the rotating arm is hollow structured.

11. The device according to claim 8, wherein the liquid guide tube is positioned inside the rotating arm; the gas guide tube is positioned inside the rotating arm.

12. The device according to claim 8, wherein the nozzle comprises a central pipe and an outer casing pipe, the central pipe is connected with the liquid guide tube or the liquid guide tube itself forms the central pipe by fixing the outlet thereof; the outer casing pipe is connected with the gas guide tube.

13. The device according to claim 8, wherein the fluid flowing in the central pipe is liquid phase fluid; the fluid flowing in the outer casing pipe is gas phase fluid.

14. The device according to claim 1, wherein during the cleaning process, the gas-liquid two-phase atomizing spray head injects the gas-liquid two-phase fluid when moving to a position corresponding to a peripheral edge of the wafer and injects the liquid phase fluid when moving to a position corresponding to a center of the wafer.

15. The device according to claim 8, wherein during the cleaning process, the gas-liquid two-phase atomizing spray head injects the gas-liquid two-phase fluid when moving to a position corresponding to a peripheral edge of the wafer and injects the liquid phase fluid when moving to a position corresponding to a center of the wafer.

16. The device according to claim 8, wherein when the gas-liquid two-phase atomizing spray head injects the liquid phase fluid, the pneumatic valve on the gas guide tube is turned off while the pneumatic valve on the liquid guide tube is turned on; the pneumatic valve on the second branch pipeline is turned off while the pneumatic valve on the first branch pipeline is turned on, such that the liquid phase fluid flow is controlled by the needle valve on the liquid supply pipeline; when the gas-liquid two-phase atomizing spray head injects the gas-liquid two-phase fluid, the pneumatic valves on the gas guide tube and the liquid guide tube are turned on; the pneumatic valve on the first branch pipeline is turned off while the pneumatic valve and the needle valve on the second branch pipeline are turned on, such that the liquid phase fluid flow is controlled by the needle valve on the second branch pipeline.

* * * * *